United States Patent [19]

Boleky et al.

[11] 4,013,484
[45] Mar. 22, 1977

[54] HIGH DENSITY CMOS PROCESS

[75] Inventors: Edward J. Boleky, Saratoga; Charles Scott, Mountain View, both of Calif.

[73] Assignee: Intel Corporation, Santa Clara, Calif.

[22] Filed: Feb. 25, 1976

[21] Appl. No.: 661,386

[52] U.S. Cl. .................................. 148/1.5; 148/175; 148/187; 357/48
[51] Int. Cl.² ..................................... H01L 21/265
[58] Field of Search .................. 148/1.5, 175, 187; 357/48

[56] References Cited
UNITED STATES PATENTS

| | | | |
|---|---|---|---|
| 3,702,428 | 11/1972 | Schmitz et al. | 148/175 |
| 3,772,097 | 11/1973 | Davis | 148/187 X |
| 3,873,383 | 3/1975 | Kooi | 148/187 |
| 3,912,555 | 10/1975 | Tsuyuki | 148/187 X |
| 3,933,528 | 1/1976 | Sloan, Jr. | 148/1.5 |

*Primary Examiner*—L. Dewayne Rutledge
*Assistant Examiner*—J. M. Davis
*Attorney, Agent, or Firm*—Blakely, Sokoloff, Taylor & Zafman

[57] ABSTRACT

A process for fabricating high density, high voltage CMOS devices. The process provides self-aligning, full channel stops which are formed prior to the fabrication of the active devices. The aligned full channel stops and a well are formed in the substrate without intermediate masking.

20 Claims, 9 Drawing Figures

HIGH DENSITY CMOS PROCESS

BACKGROUND OF THE INVENTION

1. Field of the Invention

The invention relates to the field of CMOS processes and fabrication techniques.

2. Prior Art

Complementary metal-oxide-semiconductor (CMOS) transistors also known as COS/MOS transistors are well known in the art and are often employed in applications requiring low power consumption. For example, such devices because of their low "standby" power consumption are used for battery operated wrist-watches, hand-held calculators, and the like. Moreover, CMOS field-effect transistors are characterized by their high switching speeds and their very high noise immunity over a wide range of power supply voltages.

In high voltage LSI CMOS devices, channel stops (also referred to as "guard bands") are used in the substrate, surrounding each of the active devices. Channel stops are typically highly doped "frames" of the same conductivity type as the host region for the active device. They are used to reduce leakage between neighboring device such as that caused by spurious MOS action. This MOS action often results from potentials on interconnecting lines, and the like.

High voltage LSI CMOS devices not employing channel stops, often use thick field oxides and heavily doped substrates and wells to reduce parasitic MOS action. These devices have high threshold voltages, high capacitance, high body-effect, and thus, poor AC performance. Wide diffusion spacing is required resulting in low density circuits. Moreover, masking becomes more difficult on the uneven surfaces caused by the thick field oxides.

In other CMOS circuits moderately thick oxides are employed with full channel stops (that is, an n-type channel stop surrounding the n-channel device and a p-type channel stop surrounding the p-type device). Full channel stops are most often spaced-apart from the active devices which they surround since they are heavily doped (diffused) regions which would otherwise provide low breakdown voltage junctions when contiguous with the source and drain regions. An example of this structure is shown in *FET Principles, Experiments, and Projects* by Edward M. Noll published by Howard W. Sams & Company, Inc. and the Bobbs-Merrill Company, Inc. (second edition) at page 241, FIG. 8-3. These circuits are of lower density.

Another technique for providing channel stops through use of an ion implanted surface layer is described in "Surface Doping Using Ion Implantation For Optimum Guard Layer Design In COS/MOS Structures" by Douglas and Dingwall, *IEEE Transactions on Electron Devices* (Vol. ED22), October 1975, beginning at page 849. As may be seen in FIG. 3 the n-channel stop and p-channel stop are spaced apart, thus decreasing device density.

In one commonly employed process for fabricating CMOS devices, a well (such as a p-well) is first formed with a masking operation. Then, with another masking operation, the n-channel device is fabricated in the p-well along with the formation of the n-channel stop. Following this, additional masking is required to define and form the p-channel device and p-channel stop. The channel stops, of necessity, must be spaced apart from the active device.

With the disclosed process channel stops are fabricated in alignment with each other, and in alignment with the active devices, without extra masking steps. Moreover, the channel stops are contiguous with each other and with the source and drain regions of the active devices, permitting high density fabrication. The resultant structure is relatively flat, that is, very thick field oxides are not required and the necessary field oxides are recessed into the silicon substrate.

The invented process employs, in part, local oxidation of silicon (LOCOS) techniques. For a general discussion of this technology, see *Semiconductor Silicon* edited by Huff & Burgess, Princeton, N.J., 1973, page 860 under the title "Selective Oxidation of Silicon and its Device Application" by Kooi & Appels; "Invited:-MOS Effects and Silicon Device Technology" by Kooi, *Proceedings of the 5th Conference* (1973 International) *on Solid State Devices*, Tokoyo, 1973, page 427; and, "Local Oxidation of Silicon/CMOS Technology/Design System for LSI in CMOS", *IEEF International Solid State Circuit Conference* (Digest of Technical Papers) Session VI:LSI Logic, 1974, beginning on page 60.

SUMMARY OF THE INVENTION

A process is described for forming channel stops of opposite conductivity type in the intermediate region of a substrate between a first area and a second spaced-apart area. The first and second areas are for active devices. First a masking member is formed on the substrate; this member protects a portion of the intermediate region. Then, the unprotected portion of the intermediate region is doped with a dopant of a first conductivity type to form a first channel stop. Next, the masking member is removed allowing the intermediate region to be doped with a dopant of a second conductivity type, forming a second channel stop, adjacent to the first channel stop. In this manner, full channel stops are fabricated which are in alignment with one another and which are in alignment with the first and second areas.

The drawings are not to scale in order that the various regions and areas of interest may be clearly illustrated.

DETAILED DESCRIPTION OF THE INVENTION

A process and method are disclosed for fabricating high density, high voltage (e.g. 3 to 18 volts) complementary metal-oxide-semiconductor (CMOS) devices, also referred to as COS/MOS devices in the prior art. In particular, the process provides full channel stops, in alignment with one another and with the active devices which they surround. The process employs known MOS fabrication technology including ion implantation. With the process, the channel stops are formed in the substrate in alignment with protected areas which areas receive the active devices and in alignment with each other, that is, the channel stops are formed, in the presently preferred process, prior to the fabrication of the active devices.

FIGS. 1 through 8 are used to describe the protection of the areas which receive the active devices and the formation of the p-well, channel stops, and related field oxide. FIG. 9 illustrates the substrate with active devices formed beneath the previously protected areas. Well known processes may be employed for the fabrication of the gates and source and drain regions of the active devices of FIG. 9.

Numerous details of the presently preferred process such as specific conductivity type, specific impurity, impurity concentrations, processing times and temperatures have been included to provide a complete understanding of the invented process. However, as will be appreciated, variations of the described process may be employed, these variations will be obvious to one skilled in the art. In some instances, detailed descriptions of well known photolithographic steps have not been included in order not to obscure the invented process in detail.

Figure 1:
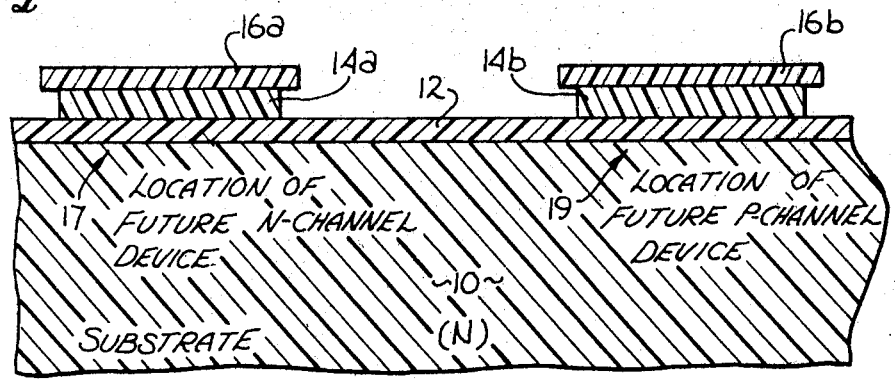
FIG. 1 is a cross-sectional, elevation view of a portion of a silicon substrate which includes an oxide layer on the upper surface of the substrate and a pair of spaced-apart silicon nitride and silicon oxide members on the silicon oxide layer.

Referring now to FIG. 1 and the portion of an n-type silicon substrate 10, the areas 17 and 19 (and the substrate regions below these areas) are the locations of future active devices. Channel stops, however, are first fabricated surrounding these areas. The following description of the process primarily describes the intermediate area and region between the protected areas 17 and 19, but as will be apparent channel stops are formed in the substrate and surround these protected areas. Also, as will be appreciated, since only a portion of the substrate 10 is illustrated, other channel stops and active devices may be simultaneously fabricated on the remainder of the substrate.

The n-type substrate 10 for the presently preferred process (called the ARAB process) has a resistivity of approximately 3.5 ohm-cm; this resistivity yields a threshold voltage of approximately 1.5 volts for the p-channel device with a gate oxide thickness of approximately 1100A. Prior to defining the areas 17 and 19, an oxide layer 12 (i.e. $SiO_2$, SiO) of approximately 300A, or more is formed on the upper surface of the substrate 10, this oxide layer may be a thermally grown layer. Then a layer (approximately 1000A thick) of silicon nitride ($Si_3N_4$) is formed on the exposed surface of the oxide layer 12. This silicon nitride layer is etched with a masking step employing well known photolithographic techniques to form silicon nitride layers 14a and 14b over areas 17 and 19, respectively. In the presently preferred process oxide masking members 16a and 16b are employed for etching the silicon nitride layer. However, other known masking members may be used to define layers 14a and 14b.

Figure 2:
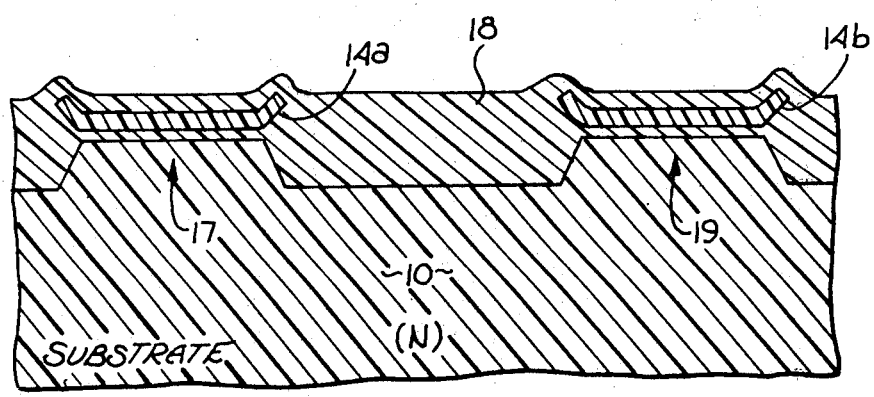
FIG. 2 illustrates the substrate of FIG. 1 with a field oxide layer.

A field oxide 18 is then formed on the upper surface of the substrate as is illustrated in FIG. 2. This oxide in the present preferred process is approximately 5,000A thick; this thickness is selected, as will be seen, to block a subsequent high energy implantation. As is illustrated in FIG. 2, the oxide grown above areas 17 and 19 is substantially thinner since the silicon nitride layers blocks the formation of the field oxide.

Figure 3:
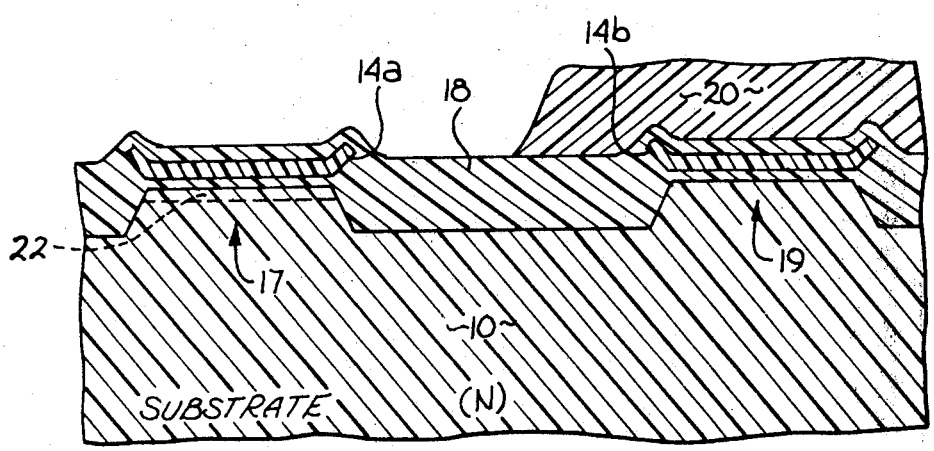
FIG. 3 illustrates the substrate of FIG. 2 with a portion of the substrate covered with a photoresist layer and with another portion of the substrate doped by ion implantation.

Next, as illustrated in FIG. 3, the photoresist layer is formed on the field oxide and patterned with well known photolithographic techniques to form the photoresist layer 20. The photoresist layer covers the area 19 and extends partway into the intermediate region between areas 17 and 19. From a plan view of the entire substrate the photoresist layers 20 overlap each of the silicon nitride layers 14b. The masking used to form the photoresist layer 20 covers approximately 50% of the intermediate region in the presently preferred embodiment.

A p-type impurity is then implanted beneath the silicon nitride layer 14a to form the ion implanted region 22. The energy level for this ion implantation is high enough for the dopant to penetrate the silicon nitride layer 14a and the oxide disposed below and above this layer. However, the energy level is maintained low enough so that the impurity does not penetrate the field oxide 18, or the photoresist layer 20 and the silicon nitride layer 14b. Thus, only region 22 which is defined by layer 14a, and like regions on the substrate, are ion implanted. In the presently preferred process a boron implant ($B_{11}$) at 80KEV is employed to obtain a dopant level of $7.3 \times 10^{12}/cm^2$ when the photoresist layer 20 is approximately 8,000A thick.

Figure 4:
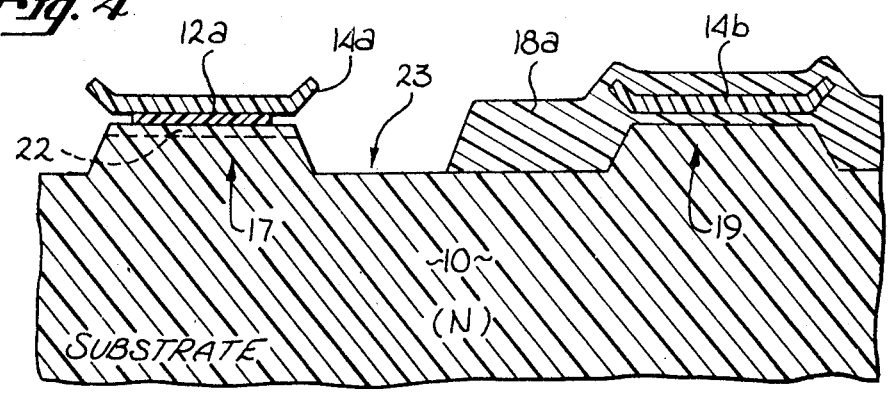
FIG. 4 illustrates the substrate of FIG. 3 with a portion of the field oxide layer etched and without the photoresist layer.

After this implantation, the photoresist layer 20 is used as a masking member to etch the field oxide 18, forming the layer 18a, and thereby exposing surface area 23 of the substrate (FIG. 4). The photoresist layer 20 is then removed to obtain the substrate configuration shown in FIG. 4. The etching of the field oxide and the removal of the photoresist may be performed in an ordinary manner.

Figure 5:
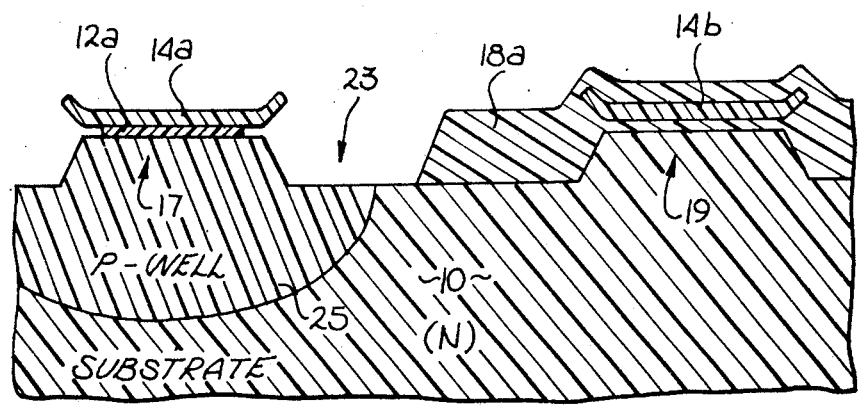
FIG. 5 illustrates the substrate of FIG. 4 after a drive-in step during which a p-well is formed in the substrate.
Figure 6:
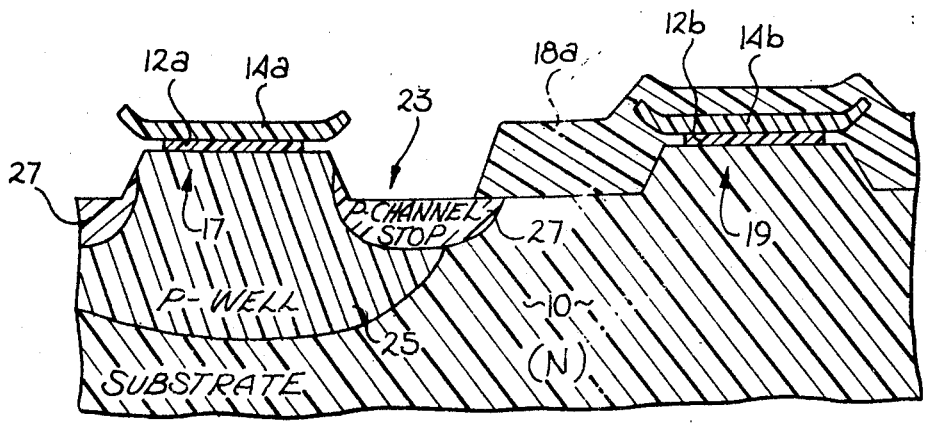
FIG. 6 illustrates the substrate of FIG. 5 with a first channel stop.

The substrate is next subjected to a drive-in cycle to drive-in the implanted boron, thereby defining the p-well 25 of FIG. 5. The parameters of this drive-in cycle and to provide a target threshold voltage for the n-channel device of approximately 1.5 volts, assuming a gate oxide thickness of approximately 1100A. Moreover, the p-well 25 must be sufficiently deep to avoid shorting of the source and drain regions of the n-channel device to the substrate 10. For the presently preferred process a drive-in cycle of approximately 21 hours at 1200° C in a nitrogen atmosphere has been found to yield the target threshold and to provide an acceptable, 9 micron deep, p-well.

At this point in the processing it should be noted that the n-channel device threshold level which is partly determined by the boron concentration in p-well 25, is substantially more controllable and reproducible than in prior art processes. Unlike most prior art processes, the p-well surface is protected from subsequent oxidation (and the resultant boron loss) by the oxide layer 12a and silicon nitride layer 14a (FIG. 5). Typically in prior art processing, a thick field oxide is grown over the p-well after a drive-in cycle. Moreover, it should be noted that the p-well 25 is aligned with the silicon nitride layer 14a (except for the lateral diffusion which occurs during the drive-in cycle). In the prior art, the n-channel device is generally formed within a larger p-well which well is defined by an early masking step. This p-well extends beyond the edge of the n-channel device, under the field oxide, to compensate for masking alignment variations. Thus in these prior art devices, the spacing between the edge of the n-channel device and the edge of the p-well is greater, thereby reducing device density.

After the formation of the p-well 25 shown in FIG. 5, the p-channel stop 27 (FIG. 6) is introduced. In the presently preferred process, a boron ($BF_2$) implant at a relatively low energy level is employed to prevent the boron from penetrating the silicon nitride layers 14a and 14b, and the field oxide layer 18a. Implantation of $BF_2$ at 50 KEV to a level of $7.0 \times 10^{13}/cm^2$ followed by a drive-in cycle of 2 hours at 1075° C is used. This results in a channel stop depth of approximately 2.5 microns and a concentration level (after a subsequent arsenic implant) low enough to sustain a high breakdown voltage (in excess of 25 volts) while providing a field threshold greater than 25 volts. The boron concentration level and channel stop depth are greater than required for the channel stop per se, in order to compensate for a subsequent n-channel stop implantation. Note that the p-channel stop 27 is aligned with the edges of the layers 14a, 18a and the p-well.

Figure 7:
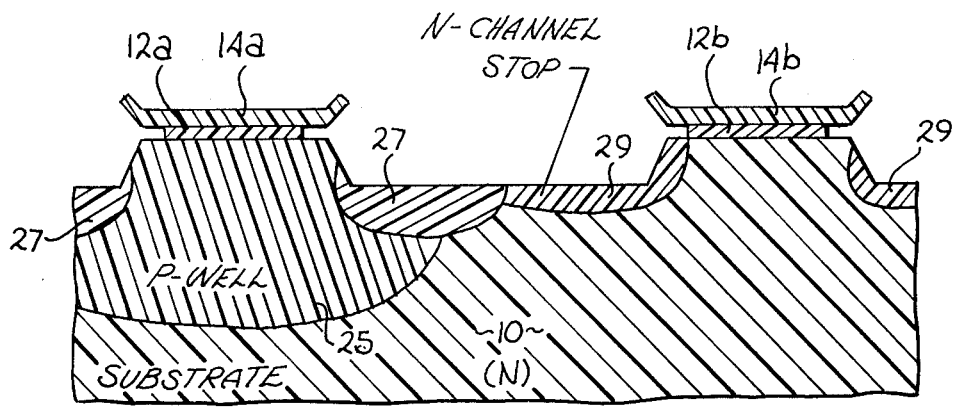
FIG. 7 illustrates the substrate of FIG. 6 with the remainder of the field oxide layer removed and with a second channel stop formed in the substrate.

Now the oxide layer 18a is removed as shown in FIG. 7 with a known etchant. An n-type dopant is then introduced to form the n-channel stop 29 without additional masking. In the presently preferred process an arsenic implant at approximately 50 KEV is used to obtain a concentration level of $7 \times 10^{11}/cm^2$, followed by a drive-in cycle at 1,000° C for one-half hour. The energy level of this implantation is selected to prevent the arsenic impurity from penetrating the silicon nitride layers 14a and 14b. The resultant n-channel stop 29 is aligned between the p-channel stop 27 and the edges of the silicon nitride layer 14b. As mentioned, since the p-channel stop 27 is relatively deep and more heavily doped the introduction of the arsenic dopant into this region does not significantly effect the performance of the channel stop 27.

Figure 8:
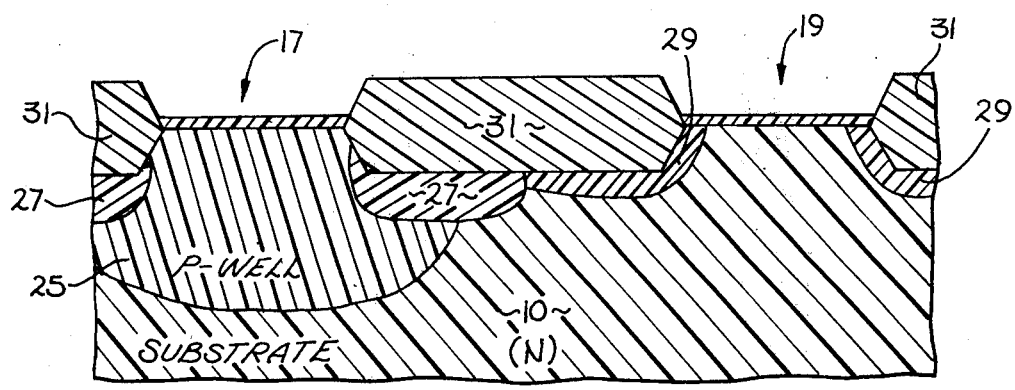
FIG. 8 illustrates the substrate of FIG. 7 with a second field oxide layer and without the silicon nitride members.
Figure 9:
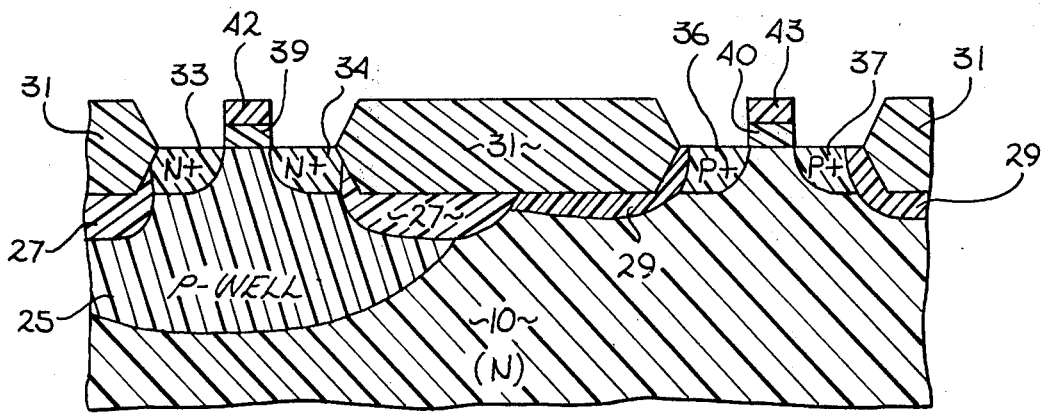
FIG. 9 illustrates the substrate of FIG. 8 with a pair of active devices fabricated in the substrate, one such active device is formed in the p-well adjacent to one channel stop while the other is formed in the substrate adjacent to the other channel stop.

Next a second field oxide layer 31 which may be approximately one micron thick, is formed on the substrate (FIG. 8). This oxide layer grows over the channel stops since the silicon nitride layers 14a and 14b blocks its formation. Following this, the silicon nitride layers 14a and 14b may be removed employing a known etchant.

Now the active devices may be fabricated in the regions below areas 17 and 19. For example in FIG. 9, a gate oxide 39 and a polycrystalline silicon gate electrode 42 are shown disposed above and between source and drain regions 33 and 34 of the n-channel device in the p-well 25. These source and drain regions are formed in alignment with the gate 42 and the field oxide 31. Similarly, a gate oxide 40 and polycrystalline silicon gate electrode 43 for the p-channel device are shown in alignment with the source and drain regions 36 and 37. Once again these source and drain regions may be formed in alignment with the field oxide 31. Thus, in the resultant CMOS structure the source and drain regions for the active devices automatically are aligned with the channel stops. As mentioned known processes may be employed to fabricate these active devices. Also standard processing may be used to add aluminum lines and contacts.

An alternate procedure (called the BASE process) for the above described ARAB process, includes the introduction of the n-type impurity for the n-channel stop to the substrate of FIG. 1 after the layers 14a and 14b have been fabricated. For example, an n-type (arsenic) impurity may be ion implanted after the oxide layer 12 has been etched to expose the substrate; the energy level used for this implantation is sufficiently low to prevent implantation in the areas 17 and 19. Then the steps described in conjunction with FIGS. 2, 3, and 4 are performed as described above.

Next, for this alternate procedure, before the drive-in cycle for the p-type well 25, the silicon at the surface of substrate 10, shown as area 23 is etched to remove the arsenic doped silicon. For example, 2,500A of silicon are etched with a known silicon etchant. Then the above described drive-in cycle is used to form the p-well 25.

A p-type dopant is next introduced into the silicon, for example, by ion implantation boron ($BF_2$) to form the p-channel stop 27. This implantation is performed at a sufficiently low energy level so that implantation only occurs in the substrate at area 23. A drive-in step is now employed to drive-in the channel stop dopant. Following this the oxide layer 18a may be removed and the field oxide 31 of FIG. 8 may be formed on the substrate as described above.

This alternate procedure eliminates the requirement for a relatively deep more heavily doped boron channel stop (needed to compensate for the arsenic), thereby providing a higher breakdown junction with less capacitance. However, this alternate process requires the etching of the monocrystalline silicon substrate to remove the implanted n-type dopant, although a shallow etch is used.

In a variation to this alternate process, the silicon etching may be eliminated by compensating for the n-type dopant in the p-channel stop region. That is, a higher concentration and deeper penetration of the boron may be employed to compensate for the arsenic in the p-channel stop region.

Thus, a CMOS process has been disclosed which permits the fabrication of high density, high voltage devices with full channel stops. The full channel stops are formed in alignment with one another, and in alignment with the active devices.

We claim:

1. On a silicon substrate which includes a first area for a first MOS device and a second spaced-apart area for a second MOS device, a process for forming channel stops of opposite conductivity type in the intermediate region between said first and second areas, comprising the steps of:

forming a masking member on said substrate, said masking member protecting a portion of said intermediate region;

doping the portion of said intermediate region unprotected by said masking member with a dopant of a first conductivity type to define a first channel stop;

removing said masking member;

doping said intermediate region with a dopant of a second conductivity type forming a second channel stop adjacent to said first channel stop;

whereby adjacent full channel stops may be fabricated in alignment with each other and with said first and second areas.

2. The process as defined by claim 1 wherein said doping of said first and second channel stops is formed with ion implantation.

3. The process defined by claim 1 wherein said first and second areas are covered with silicon nitride prior to said formation of said masking member.

4. The process defined by claim 3 wherein a field oxide is formed on said substrate prior to said formation of said masking member.

5. The process defined by claim 4 including the step of forming a well region beneath said first area with ion implantation through said silicon nitride and with a drivein cycle prior to said doping of said first channel stop.

6. A process for fabricating CMOS devices on a silicon substrate comprising the steps of:
defining a spaced-apart first area and second area on said substrate wherein at least the intermediate area between said first and second areas is covered with a protective layer;
forming a masking member on said protective layer said masking member covering said second area and extending from said second area partway onto said intermediate area;
ion implanting said first area with a dopant of a first conductivity type;
removing portions of said protective layer employing said masking member as a mask, such that at least said protective layer adjacent to said first area is removed;
doping said substrate adjacent to said first area with a dopant of said first conductivity type to form a first channel stop of said first conductivity type;
removing at least said masking member;
doping said intermediate area with a dopant of a second conductivity type thereby forming a second channel stop of said second conductivity type;
fabricating active devices in said substrate at said first and second areas;
whereby full channel stops are fabricated which are in alignment with one another and in alignment with said active devices.

7. The process defined by claim 6 wherein said protective layer comprises a field oxide.

8. The process defined by claim 7 wherein said masking member comprises a photoresist material.

9. The process defined by claim 8 wherein said field oxide and photoresist material are removed prior to said doping of said second channel stop.

10. The process defined by claim 9 wherein a second field oxide is formed on said substrate over said intermediate area before said fabrication of said active devices.

11. The process defined by claim 6 wherein said spaced-apart first area and second area are defined with silicon nitride.

12. The process defined by claim 11 wherein said protective layer comprises a field oxide layer.

13. The process defined by claim 12 wherein said first conductivity type is a p-type.

14. The process defined by claim 13 wherein said removal of portions of said protective layer is performed by etching.

15. The process defined by claim 14 including a drive-in step for driving in said ion implanted dopant to define a p-well, said p-well for receiving one of said active devices.

16. On a silicon substrate which includes a first area for a first MOS device and a second spaced-apart area for a second MOS device, a process for forming channel stops of opposite conductivity type in the intermediate region between said first and second areas, comprising the steps of:
doping said intermediate region with an impurity of a first conductivity type to define a first channel stop of a first conductivity type;
forming a masking member on said substrate, said masking member protecting a portion of said intermediate region;
doping the unprotected portion of said intermediate region of said silicon substrate with a dopant of a second conductivity type to define a second channel stop of a second conductivity type;
whereby full channel stops may be fabricated in alignment with each other and with said first and second areas.

17. The process defined by claim 16 wherein silicon nitride layers are formed over said first and second areas prior to said doping with said first conductivity type dopant and wherein said second conductivity dopant compensates for said first conductivity type dopant in said unprotected portions of said intermediate region.

18. The process defined by claim 16 including the step of etching silicon from said unprotected portion of said intermediate region of said substrate prior to said doping with said second conductivity type dopant.

19. The process defined by claim 18 wherein said doping with said first conductivity type dopant comprises the ion implantation at an energy level such that said first conductivity type dopant does not dope said first and second areas.

20. The process defined by claim 19 wherein silicon nitride layers are formed over said first and second areas prior to said ion implantation of said first conductivity type dopant.

* * * * *